US 6,665,367 B1

(12) United States Patent
Blair

(10) Patent No.: US 6,665,367 B1
(45) Date of Patent: Dec. 16, 2003

(54) EMBEDDED FREQUENCY COUNTER WITH FLEXIBLE CONFIGURATION

(75) Inventor: James L. Blair, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 3 days.

(21) Appl. No.: 10/034,455

(22) Filed: Dec. 27, 2001

(51) Int. Cl.[7] .............................................. G06M 11/04
(52) U.S. Cl. ..................... 377/20; 324/76.39; 324/76.48; 327/40; 327/42
(58) Field of Search ..................... 377/20; 324/76.39, 324/76.48; 327/40, 42

(56) References Cited

U.S. PATENT DOCUMENTS 5,563,928 A * 10/1996 Rostoker et al. .............. 377/20
6,300,823 B1 * 10/2001 Zhou et al. ................. 327/551

* cited by examiner

Primary Examiner—Margaret R. Wambach
(74) Attorney, Agent, or Firm—Incaplaw; Terrance A. Meador

(57) ABSTRACT

An integrated circuit according to the present invention includes application-specific circuitry and an embedded counter assembly capable of measuring the frequency of one or more clock signals, which may be generated internally by the integrated circuit or externally by one or more sources external to the integrated circuit. The embedded counter assembly utilizes a reference clock signal having known characteristics, and measures the frequency of an unknown clock signal based upon the reference clock signal. The embedded counter assembly is capable of measuring the frequency of internal clock signals that are otherwise inaccessible via external output pins.

23 Claims, 3 Drawing Sheets

EMBEDDED FREQUENCY COUNTER WITH FLEXIBLE CONFIGURATION

FIELD OF THE INVENTION

The present invention relates generally to electronic circuits. More particularly, the present invention relates to digital frequency counters that measure the frequency of clock signals.

BACKGROUND OF THE INVENTION

A discrete digital counter device can be configured as a frequency counter to determine the number of signal cycles per unit of time, or as an interval timer to determine the duration of a signal event. A number of functional forms and applications for counters currently exist, including complex laboratory test instruments, solid state frequency counters, and discrete chip-based interval timers. Chip-based implementations may include sub-function support of application-specific internal frequency or time interval measurements.

As is most often the case, the important clock characteristic of frequency accuracy is left to external measurement hardware located within the system (e.g., a communication system) that utilizes the clock signals. Conventional techniques for monitoring a plurality of clock signals require a plurality of discrete counter devices. In practice, the deployment of a plurality of counter devices may also require a number of interconnecting circuit boards, input and output connections, and other technical considerations that add to the complexity of the application. Such limitations are exacerbated in applications that utilize a large number of clock signals (or other cyclical signals) that may need to be monitored or measured. Another practical limitation of discrete counter devices is that they cannot be utilized to measure the frequencies of internal clock signals, i.e., clock signals that are not accessible via normal output pins of the integrated circuit device.

BRIEF SUMMARY OF THE INVENTION

An embedded counter device according to the present invention can be realized in conjunction with application-specific circuitry to measure any number of internal and/or external clock signals utilized by the application-specific circuitry. The embedded counter device can be implemented in a manner that enables the selective measurement of a number of possible clock signals (the set of measurable unknowns) relative to any one of a plurality of reference signals inclusive of the set of measurable unknowns and exclusive of the unknown itself.

The above and other aspects of the present invention may be carried out in one form by an integrated circuit device having a die, application-specific circuitry formed on the die, where the application-specific circuitry utilizes a number of internal clock signals, and a counter formed on the die. The counter is configured to receive a number of input signals comprising those associated with internal clock signals and those selected from a set of externally applied clock signals.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. For example, the present invention may employ various integrated circuit components, e.g., memory elements, digital signal processing elements, logic elements, look-up tables, and the like, which may carry out a variety of functions under the control of one or more microprocessors or other control devices. In addition, those skilled in the art will appreciate that the present invention may be practiced in conjunction with any number of application-specific circuits, techniques, and protocols and that the systems described herein are merely exemplary applications for the invention.

It should be appreciated that the particular implementations shown and described herein are illustrative of the invention and its best mode and are not intended to otherwise limit the scope of the invention in any way. Indeed, for the sake of brevity, conventional techniques for signal processing, digital counting, digital logic processing, microprocessor control, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

Although the techniques of the present invention can be implemented in connection with a number of different integrated circuit (IC) applications, the following description focuses on telecommunication ICs that typically include a large number of internal and externally applied clock sources and a large number of clock domains. The clock sources may be independent or interdependent as a consequence of the application-specific nature of the IC itself and its intended application. The very nature of the data/clock switching and manipulation functionality of most telecommunication ICs make them ideally suited to integrally include frequency measurement capabilities.

Figure 1:
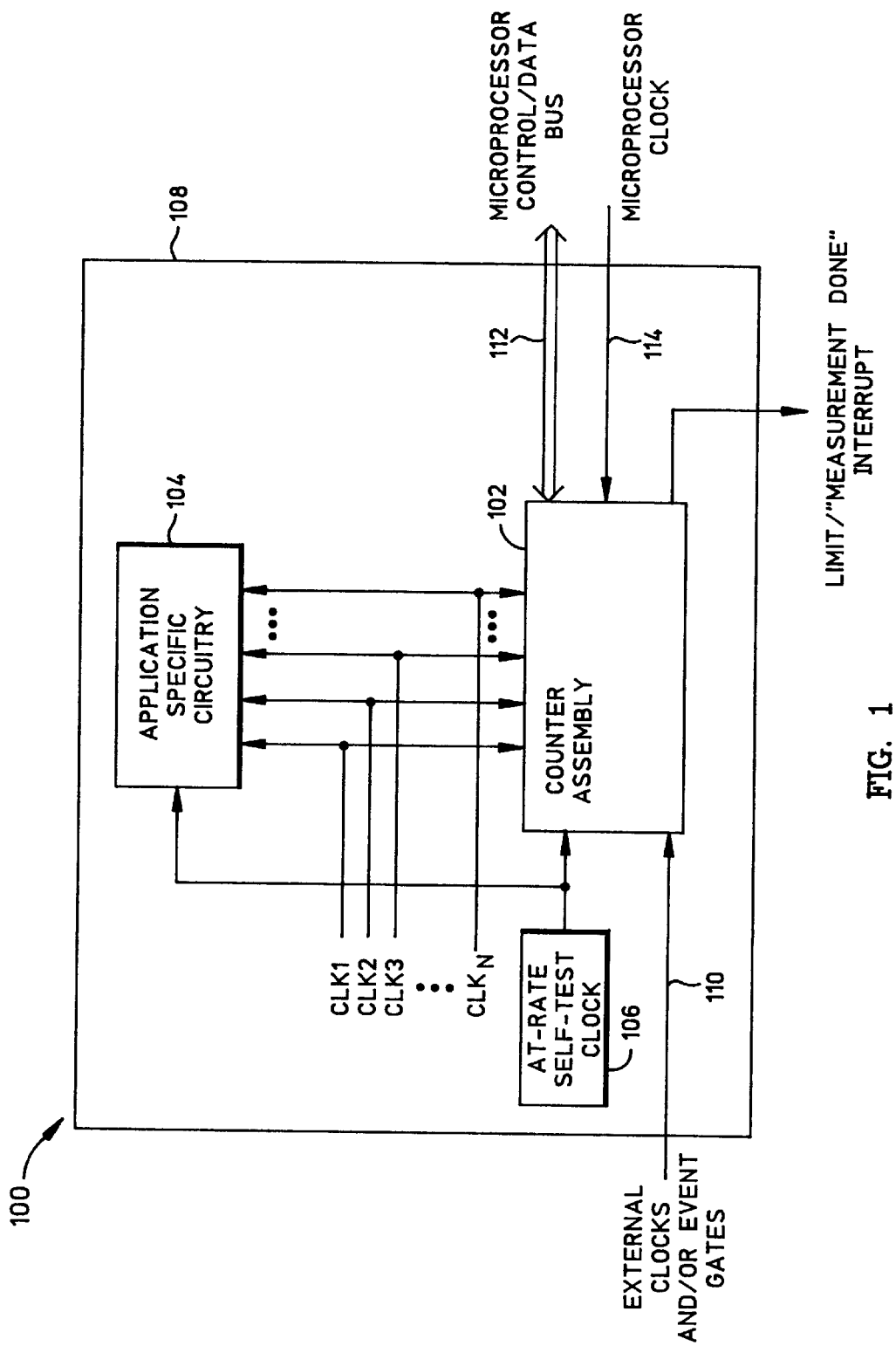
FIG. 1 is a schematic diagram representing an integrated circuit device that incorporates a counter assembly.

FIG. 1 is a schematic diagram that represents an IC 100 incorporating a counter assembly 102 as it may be used in conjunction with application-specific circuitry 104. IC 100 may also include an at-rate self-test clock source or generator 106. In accordance with the example embodiment depicted in FIG. 1, counter assembly 102, application-specific circuitry 104, and self-test clock generator 106 are each formed on an IC die 108 associated with an IC package or chip. In other words, the combination of elements are embedded together and realized on a single substrate. In this regard, IC 100 may be designed and manufactured in accordance with any number of conventional development and fabrication techniques.

Application-specific circuitry 104 may be suitably configured in accordance with conventional techniques. The function of application-specific circuitry 104 can vary depending upon the desired use of IC 100. The techniques of the present invention can be employed in the context of a variety of known circuit applications; for the sake of brevity and clarity, such circuit applications will not be described herein. Practical embodiments of IC 100 may utilize application-specific circuitry 104 related to known telecommunication devices, e.g., Synchronous Optical Network (SONET), Synchronous Digital Hierarchy (SDH), Packet Over SONET (POS), Gigabit/10-Gigabit Ethernet (GbE and 10-GbE, respectively), and Network Node Interface (Digital Wrapper) applications. Although not depicted in FIG. 1, IC 100 would typically include a number of inputs and outputs associated with application-specific circuitry 104. In practice, application-specific circuitry 104 may utilize any number of internal and/or external clock signals. As used herein, a "clock signal" is a signal having a cyclical or periodic characteristic having a measurable frequency. In this regard, a clock signal may be a dedicated signal that is strictly used by other elements or components as a clock or timing signal. Alternatively, a clock signal may be that of embedded timing within a data signal, a control signal, or other signal having an underlying periodicity or otherwise extractable clock signal. As used herein, an "internal clock signal" is a clock signal that is generated and used internally by IC 100, while an "external clock signal" is a clock signal that is generated externally and provided as an input to IC 100. In a practical embodiment (especially one that employs a large number of clock signals), internal clock signals need not be or, due to physical device package constraints such as limited pin count, can not be accessible from points external to IC 100. In other words, it may be impractical if not impossible to externally monitor or measure some internal clock signals used by IC 100.

In the example embodiment shown in FIG. 1, a number (N) of internal clock signals are utilized by application-specific circuitry 104. Each of the N internal clock signals is also routed to counter assembly 102. Although not shown in FIG. 1, application-specific circuitry 104 can utilize any number of internal clock signals that are not routed to counter assembly 102. As described above, application-specific circuitry 104 may also utilize any number of external clock signals (not shown), which may or may not be shared with counter assembly 102. Conversely, counter assembly 102 may utilize any number of external clock signals which may or may not be shared by the application-specific circuitry 104. At-rate clock generator 106 is configured to generate a clock signal that can be used to facilitate circuitry maximum rate operating conditions during IC 100 wafer and/or packaged part production as well as user in-circuit self-testing. As shown in FIG. 1, the output of at-rate clock generator 106 (i.e., the self-test clock signal) is routed to both application-specific circuitry 104 and counter assembly 102. In this regard, the self-test clock signal may be considered to be one of the N clock signals. In practice, IC 100 can utilize any number of self-test clock generators, and each self-test clock generator may be capable of generating any number of clock signals.

IC 100, and counter assembly 102 in particular, may be configured to receive any number of external clock or gate signals. FIG. 1 shows an external clock/gate signal(s) 110 received by counter assembly 102. External clock/gate signal 110 is generated by a source external to IC 100 and may be provided to IC 100 via any number of conventional input elements. As described in more detail below, this external signal may be used as a reference clock signal, a measurement clock signal (i.e., a clock signal having an "unknown" frequency to be measured by counter assembly 102), or an event gate signal. As used herein, an "event gate signal" is a signal associated with the time duration of an event, e.g., interval between SONET/SDH Alarm Indication Signal (AIS) occurrences, signal transit time through a communication network, system fault recovery latency, separation of related signaling events within a serial bit stream, processing time of certain message events, and the like. In accordance with one practical embodiment, event gate signal 110 marks the beginning of an event with a low-to-high (or high-to-low) transition, remains high (or low) during the event, and marks the end of the event with a high-to-low (or low-to-high) transition. Alternatively, event gate signal 110 may be configured to mark the beginning and end of an event with discrete pulses. In practice, the specific manner in which event gate signal 110 defines the duration of the event may differ according to the application or environment in which IC 100 is deployed.

Counter assembly 102 receives any number of clock signals (e.g., internal clock signals, external clock signals, self-test clock signals, and the like) and performs various measurements associated with one or more of the received signals. For example, counter assembly 102 may be arranged, programmed, controlled, or otherwise configured to: measure the frequency of at least one clock signal; compare the frequency of at least one clock signal to an upper frequency limit and/or a lower frequency limit; generate an alarm or other notification when the frequency of a measured clock signal exceeds a frequency threshold; and/or measure the time duration of an event. Counter assembly 102 may include a variety of digital logic (and other) components arranged to receive the clock signals, perform measurements and comparisons, and generate suitable output signals associated with characteristics of the input clock signals.

Counter assembly 102 can be flexibly configured to perform any number of the above functions in response to instructions from a suitable control system. For example, a practical embodiment of IC 100 may be deployed in an environment having a microprocessor. The microprocessor may be configured to also process data associated with application-specific circuitry 104 and/or components external to IC 100. In this regard, counter assembly 102 can be connected to an external microprocessor control/data bus 112 that carries programming, control instructions, and frequency measurement data to/from various components of counter assembly 102. As depicted in FIG. 1, IC 100 may be suitably configured for connection to bus 112 and for receiving a microprocessor clock signal 114. The present invention can utilize any conventional microprocessor for use as a control system. Suitable microprocessors are known to those skilled in the art and the design and operation of such microprocessors will not be described herein.

Figure 2:
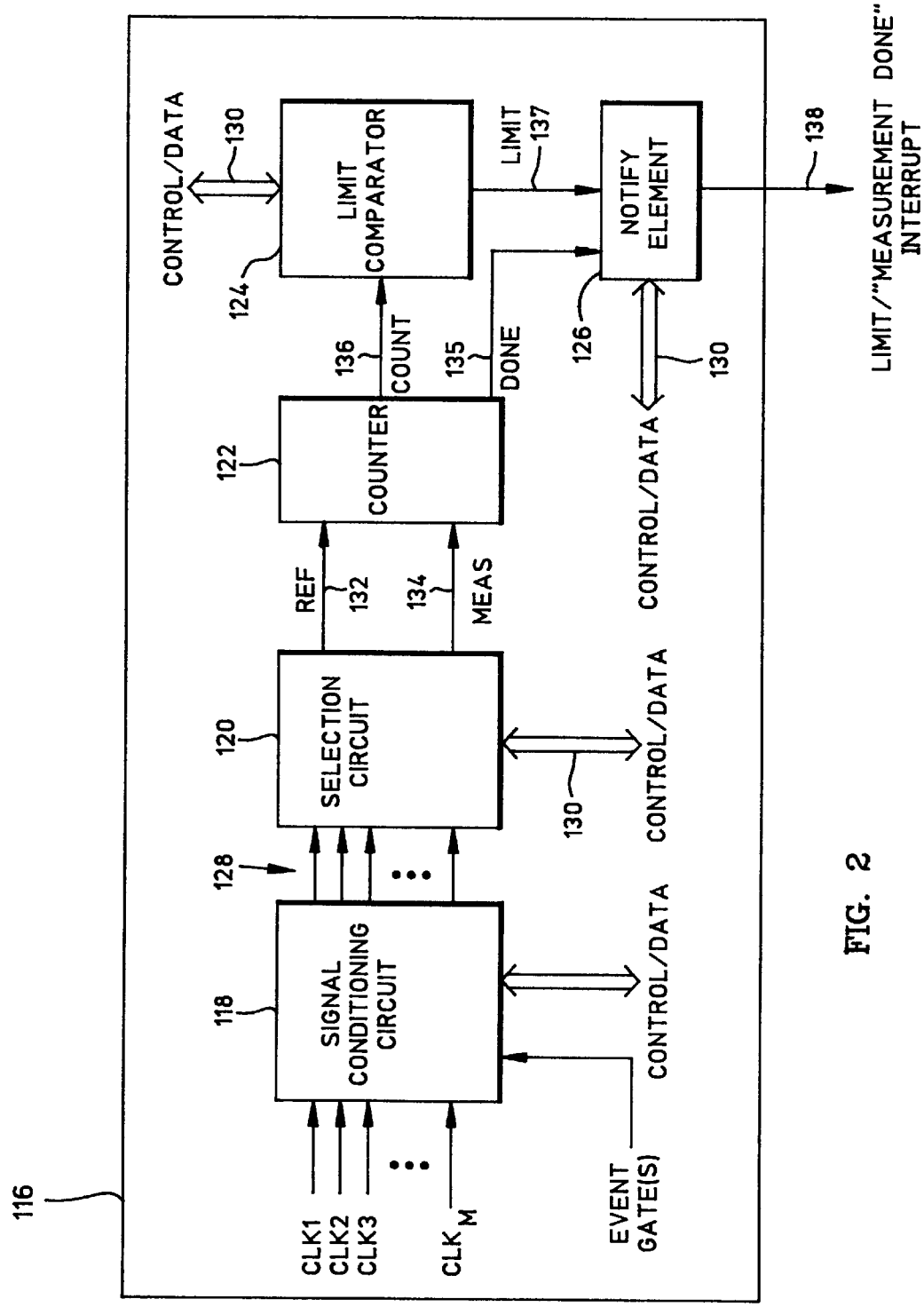
FIG. 2 is a schematic diagram representing a counter assembly configured in accordance with the present invention.

FIG. 2 is a schematic diagram representing a counter assembly 116 configured in accordance with the present invention. Counter assembly 102 (see FIG. 1) may be configured to operate in this manner. Counter assembly 116 generally includes a signal conditioning circuit 118, a selection circuit 120, a counter 122, a limit comparator 124, and a notify element 126. For clarity, counter assembly 116 is shown in conjunction with Mclock signals. The Mclock signals may include any number of internal clock signals, external clock signals, event gate signals, self-test clock signals, microprocessor clock signals, and other clock signals. The various clock signals may be independent or some of the clock signals may be associated with or derived from other clock signals. Counter assembly 116 is particularly useful in a practical application having a large number of internal clock signals.

Signal conditioning circuit 118 is suitably configured to receive the M clock signals, condition one or more of the clock signals, and generate one or more signals that serve as input signals 128 to selection circuit 120. In this regard, input signals 128 are associated with the M clock signals. Signal conditioning circuit 118 may be controlled or programmed by a suitable control system (e.g., a microprocessor). Accordingly, signal conditioning circuit 118 can be connected to the control system via a suitable control/data bus 130. Signal conditioning circuit 118 is capable of modifying, manipulating, or otherwise processing one or more of the M clock signals as necessary to support the particular function of counter assembly 116. For example, signal conditioning circuit 118 may be configured to reduce the frequency of a clock signal, increase the frequency of a clock signal, generate the counter frequency measurement gate reference signal, properly format internal/external event gate signals for interval measurement, or perform other operations that prepare the M clock signals for further handling by counter assembly 116. Notably, signal conditioning circuit 118 need not condition all of the M clock signals, and in some situations signal conditioning circuit 118 need not condition any of the M clock signals.

Selection circuit 120 receives a plurality of input signals 128, selects one of the input signals 128 for use as an event or frequency measurement gate reference signal 132, and selects another input signal 128 for use as an unknown frequency or event gate measurement signal 134. Selection circuit 120 allows counter assembly 116 to use any of the M clock signals as a time base against which any other of the M clock signals can be evaluated and measured. Consequently, selection circuit 120 can be suitably reconfigured to suit the particular application of counter assembly 116. For example, when measuring a signal having an unknown frequency, selection circuit 120 can be programmed to select a relatively stable and precise reference clock signal with a known frequency, while selecting the unknown frequency signal as the measurement signal 134. The operation of selection circuit 120 may be controlled or programmed by a suitable control system (e.g., a microprocessor). In the example embodiment, selection circuit 120 is connected to the common control system via control/data bus 130. Selection circuit 120 need not alter the characteristics of the input signals 128. Thus, reference signal 132 and measurement signal 134 correspond to respective input signals 128, and reference signal 132 and measurement signal 134 are respectively associated with two of the M clock signals.

Counter 122, which is connected to selection circuit 120, receives reference signal 132 and measurement signal 134 as inputs. Counter 122 is configured to measure the frequency of measurement signal 134 relative to reference signal 132. Counter 122 is also configured to generate a count output 136 that represents the frequency of measurement signal 134. Counter 122 accepts reference signal 132 as a count enabling/count inhibiting gate signal. On a high-to-low (or low-to-high) transition of reference signal 132, counter 122 is enabled to count (accumulate) cycles of measurement signal 134, with each complete cycle of measurement signal 134 being counted in succession. On a subsequent low-to-high (high-to-low) transition of reference signal 132, counter 122 ceases the counting operation, transfers the accumulated count to limit comparator 124, and resets (zeros) the counting logic in anticipation of another count accumulation cycle. The width (in units of time) of the reference signal count enabling state represents the interval over which measurement signal cycles are accumulated. This results in a final count value representing the frequency of measurement signal 134 in "cycles per unit time". For example, if reference signal 132 is conditioned such that counter 122 is enabled to accumulate 1,000 cycles of measurement signal 134 over an interval of 0.1 seconds (100 ms), the resulting frequency of measurement signal 134 would be 1,000 cycles per 100 ms or 10,000 cycles per second. In general, the number of accumulated cycles is divided by the time duration (in seconds) of the count enabling interval of reference signal 132. The resolution (degree of frequency measurement accuracy) is directly related to both the maximum count capacity of counter 122 and the width of the count enabling interval. The longer counter 122 is permitted to accumulate counts (without reaching its maximum count capacity) the greater the resulting measurement resolution. The accuracy to which the frequency of measurement signal 134 is determined is directly related to the degree of which the frequency precision and stability of reference signal 132 is known during measurement signal evaluation.

When used as an event timer, measurement signal 134 is an event gate signal that marks the beginning and the end of an event. Counter assembly 116 measures the duration of the event based upon the known (established) frequency of the reference signal and based upon the count enabling and disabling of the event gate signal. In accordance with one practical embodiment, counter 122 begins counting clock cycles of reference signal 132 in response to a first transition of the event gate signal, and counter 122 stops counting clock cycles of reference signal 132 in response to a second transition of the event gate signal. The duration of the event is calculated from the known frequency of the reference signal 132 and the number of reference signal clock cycles counted by counter 122.

Limit comparator 124, which is connected to counter 122, is configured to compare the count output 136 to a threshold value (e.g., a digital count representing an upper frequency limit, a lower frequency limit, an upper event duration, a lower event duration, or any combination thereof). Limit comparator 124 generates an output when the measured characteristic of the count output 136 exceeds one of the threshold values. In a practical embodiment, limit comparator 124 can compare the count output 136 to any number of threshold values. For example, limit comparator 124 can generate a first output if the measured frequency is greater than a first threshold, a second output if the measured frequency is greater than a second threshold that is higher than the first threshold, and the like. Similarly, limit comparator 124 can generate a third output if the measured frequency is less than a third threshold, and a fourth output if the measured frequency is less than a fourth threshold that is lower than the third threshold. The operation of limit comparator 124 may be controlled or programmed by a suitable control system (e.g., a microprocessor). In the example embodiment, limit comparator 124 is connected to the common control system via control/data bus 130.

Notify element 126, which is connected to both counter 122 and limit comparator 124, is suitably configured to generate a notification signal under either of two conditions: (1) when the frequency or event interval measurement is complete; and/or (2) when the measured characteristic of the count output 136 exceeds one of the threshold values. The notification signal 138 may simply be the acknowledgement to the system of a "measurement done" signal 135, or be a limit interrupt signal 137 that serves as a system alarm; limit interrupt signal 137 may be received by any number of components external to counter assembly 116 and interpreted in an appropriate manner. The operation of notify element 126 may be controlled or programmed by a suitable control system (e.g., a microprocessor). In the example embodiment, notify element 126 is connected to the common control system via control/data bus 130.

Figure 3:
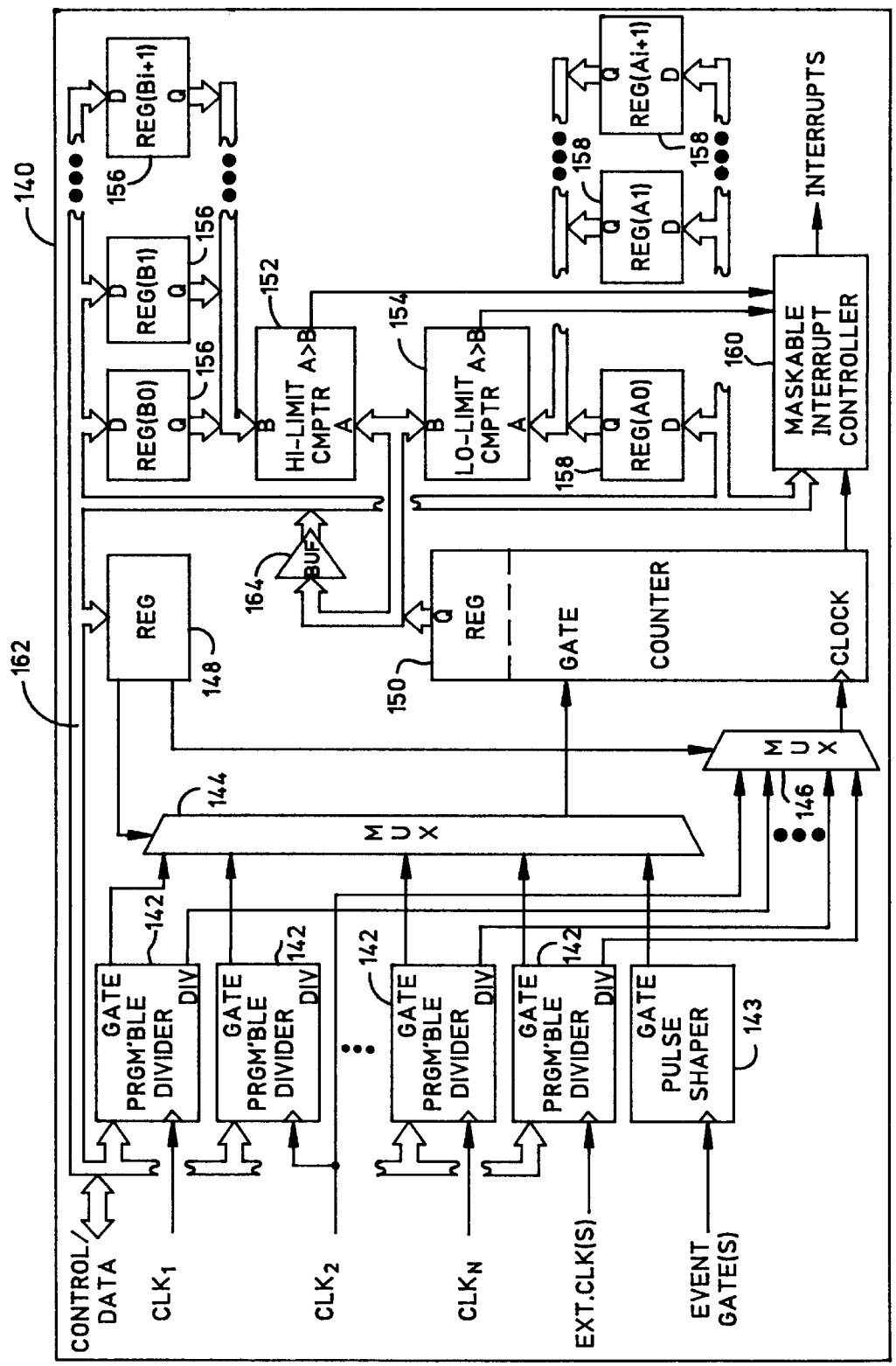
FIG. 3 is a schematic diagram representing one practical embodiment of a counter assembly.

FIG. 3 is a schematic diagram representing one practical embodiment of a counter assembly 140. Counter assembly 140 is one example of how counter assembly 116 (see FIG. 2) may be deployed in an actual device. Of course, one or more counter assemblies 140 may be utilized in IC 100 (see FIG. 1) depending on whether system requirements mandate sequential versus concurrent frequency/event duration measurements. Referring to FIG. 2, signal conditioning circuit 118 is realized by a number of programmable dividers 142 and one or more pulse shapers 143; selection circuit 120 is realized by a first multiplexer 144, a second multiplexer 146, and a control register 148; counter 122 is realized by a counter 150; limit comparator is realized by a high-limit comparator 152, a low-limit comparator 154, a plurality of high-limit registers 156, and a plurality of low-limit registers 158; and notify element 126 is realized by a maskable interrupt controller 160. A number of the components utilized by counter assembly 140 are connected to or otherwise communicate with a microprocessor control/data bus 162 that enables such components to be controlled, read, and/or programmed by a suitable microprocessor (not shown). It should be appreciated that alternate embodiments may realize counter assembly 102 using different components and in different configurations than that shown in FIG. 3.

As shown in FIG. 3, each of the internal clock signals and one or more external clock/gate signals can be individually selected either by multiplexer 144 for use as a gate signal or by multiplexer 146 for use as a clock signal. The selection by the multiplexers 144 and/or 146 is programmable via control register 148. In the example embodiment, each potential reference and measurement signal is passed through a programmable divider 142 to permit flexibility in application-specific measurement resolution tailoring. In this manner, counter assembly 140 can pre-scale the incoming frequencies to accommodate very high frequency signals. This enables counter 150 (which has a finite bit resolution) to handle unknown clock signals having high frequencies. The amount of scaling by any given divider 142 is controlled by the microprocessor. It should be noted that counter assembly 140 may utilize a single programmable divider at the output of multiplexer 144 to generate the counter gate pulse. In this case the programmable dividers 142 would be simplified to perform only a clock rescaling function and their use limited to reducing down measurement clock rates to acceptable levels that would otherwise exceed the capability of counter 150. This would, depending on the number of clocks with excessively high frequencies, potentially offer a reduction in counter assembly complexity over the plurality of programmable dividers 142 shown in FIG. 3.

In a practical realization of counter 150, the counter itself will possess a finite maximum input clock frequency limit above which the counter may fail to accumulate one or more input clock cycles of measurement signal 134 (the particular IC technology will, among other factors, largely determine this limit). For all clock inputs to counter assembly 140 that are expected to toggle at or below the maximum clock frequency limit of counter 150, no programmable divider 142 will be necessary (the use of divider 142 preceding multiplexer 144 may be programmed in this case to divide by one if the input is assignable to more than one source or eliminated altogether if provided with a dedicated range limited clock source). In FIG. 3, the input $CLK_2$ represents a clock signal that is not subject to the effect of its programmable divider 142. Input clocks, for which it is anticipated that the toggling rate may or can exceed the clock frequency limit of counter 150, will employ programmable divider 142 to scale or reduce the clock toggling rate to a level acceptable to the physical frequency limit of counter 150. When prescaling is used, the active level of the counter gate pulse must be extended in duration if the resolution of counter 150 is to remain constant.

Multiplexer 146 is controlled such that it selects one of the clock signals for use as the measurement clock signal 134. As shown in FIG. 3, the clock signal need not be divided, processed, or otherwise conditioned prior to selection by multiplexer 146. The selection by multiplexers 144, 146 can be governed by any number of criteria. For example, multiplexers 144, 146 may be programmed to select an internal reference signal and an internal measurement signal, an internal reference signal and an external measurement signal, an external reference signal and an internal measurement signal, or an external reference signal and an external measurement signal. The type of signals selected may be dependent upon the particular type of measurement being performed by counter assembly 140. For example, during a self-testing procedure, the clock signal (i.e., the self-generated clock signal) is internal and the gate signal may either be internal or external. When measuring the duration of an event, the gate signal may be an internal or externally event-driven signal and the clock signal may either be internal or external.

As described above, the selection of the particular measurement signal may be dictated by the type of measurement or test being performed by counter assembly 140. However, the selection of a suitable reference signal need not be so restricted. For example, a given reference signal may be selected based on its frequency, its frequency tolerance, its short term stability, or its availability.

For purposes of this example, counter 150 includes a gate input and a clock input. When used as a frequency counter, the gate input receives the reference signal and the clock input receives the unknown measurement signal. When used as an interval timer, the gate input receives the event gate signal and the clock input receives the reference signal. The output generated by counter 150 can be compared to an upper interval limit (using high-limit comparator 152) and/or a lower interval limit (using low-limit comparator 154). In the example embodiment, each of the internal clock signals, with the possible exception of one or more of the external clock/event signals, can be assigned a high frequency limit and a low frequency limit. These frequency thresholds are used by high-limit comparator 152 and low-limit comparator 154 during the comparison operation. Thus, counter assembly 140 may employ a plurality of high-limit registers 156, each corresponding to one of the selectable clock signals, and a plurality of low-limit registers 158, each corresponding to one of the selectable clock signals. The specific values stored in the limit registers 156, 158 can be programmed, read (for verification or programming), and controlled by the microprocessor.

The use of IC 100 as a frequency measurement device will be described with reference to FIG. 1 and FIG. 3. For purposes of this example, IC 100 utilizes a number of internal clock signals and has access to a number of external clock signals. As described above, IC 100 may receive an external reference clock signal having a known frequency, an external clock signal (including that derived from a data signal) having an unknown frequency, an external microprocessor clock signal having a known frequency, and possibly other external clock signals. Accordingly, IC 100 selects one of the clock signals for use as a reference signal and one of the clock signals for use as the measurement signal (e.g., a signal having an unknown frequency). The selection of the measurement and reference signals is dictated by the microprocessor, which controls the operation of multiplexers 144, 146. Notably, the microprocessor that runs IC 100 (and possibly the system or subsystem in which IC 100 operates) determines which of the available clock signals will be used as a reference. Since the accuracy of the frequency measurement is dependent upon the accuracy of the reference signal, an appropriately precise and stable reference can be selected based upon the desired accuracy of the measurement. Any of the measurable clock sources can be continuously monitored after being selected. Alternatively, any number of the clock sources can be sequentially evaluated on a periodic basis. When measuring the clock frequency of a measurement signal, counter assembly 140 is suitably controlled such that the measurement signal is routed to the clock input of counter 150 and such that the reference clock signal is routed to the gate input of counter 150.

If the measured frequency must be within a specified range or if the measured frequency is to be compared to high or low frequency threshold values, then the appropriate threshold values are loaded into commensurate limit registers and made available to the comparators. Referring to FIG. 3, the high-limit threshold corresponding to the selected measurement signal is taken from the respective high-limit register 156 and presented to high-limit comparator 152. Similarly, the low-limit threshold corresponding to the selected measurement signal is taken from the respective low-limit register 158 and presented to low-limit comparator 154. The programming of programmable dividers 142 is a function of whether the GATE or DIV output (see FIG. 3) is intended for immediate use. If a clock input is selected by multiplexer 144 for use as the GATE input to counter 150, the respective programmable divider is set to generate a count enable gate interval which is synchronous to and an integral multiple of the associated clock input. The resulting interval is necessarily compatible with system requirements for frequency measurement rate and, correspondingly, resolution and compatibility with the finite maximum count limit of counter 150. If a clock input is selected by multiplexer 146 to drive the CLOCK input to counter 150, the respective programmable divider 142 would be set to prescale (divide down) the clock input to a rate compatible with the maximum count rate of counter 150. For clock inputs that are driven by dedicated frequency limited sources, the scaling relationship between the clock input and the DIV programmable divider output can remain fixed, requiring only a dedicated divide-by-Q prescale. In the case of clock sources of widely varying frequencies or multiple sources, the associated programmable divider 142 may require reprogramming on the fly.

Counter 150 can be initialized prior to counting. In the example embodiment, the selected reference signal output from multiplexer 144 serves as a gating signal for counter 150. Counter 150 begins counting cycles of the measurement signal when the reference signal opens the gate and stops counting when the reference signal closes the gate. In a practical embodiment, the gate opens when the reference signal transitions from low to high and closes when the reference signal transitions from high to low (or vice versa).

Thus, counter 150 accumulates clock cycles of the measurement signal while the reference (gate) signal remains high. The time during which the gate is open can be derived from the known frequency of the reference signal and, where applicable, the respective programmable divider value. The number of clock cycles accumulated during this time period is divided by the time period to obtain the frequency of the measured signal in cycles per unit of time (e.g., cycles per second). This division may be accomplished within counter assembly 140 if designed to do so, but typically this division is performed by the supporting control system (e.g., the microprocessor) since it establishes such result attributes as resolution and measurement update rate.

Upon expiration of the gating cycle, the current counter value is transferred to a holding register portion of counter 150 to enable counter 150 to immediately begin counting another signal if necessary. In a practical embodiment, counter 150 may have a bit resolution of up to 30 bits. Thus, the various count registers are typically configured to accommodate the bit resolution of counter 150. A buffer 164 (see FIG. 3) can be employed to provide the registered counter value to the control/data bus 162 and, ultimately, to the microprocessor. When IC 100 is used as a frequency counter, the external microprocessor performs the derivations and/or calculations based on a known reference frequency, the accumulated count value, and the divider value. The microprocessor has system knowledge of at least one clock signal and its frequency, tolerance, accuracy, and the like, in order to properly scale the frequency measurement to fit within the physical limits of counter assembly 140.

The counter value may also be passed to high-limit comparator 152 and/or to low-limit comparator 154 to determine whether the frequency of the measurement signal falls within a given frequency range. High-limit comparator 152 compares the current counter value to the high-limit threshold that is currently loaded in high-limit comparator 152. If the current counter value is greater than the high-limit threshold value, then a notification or alarm signal is sent to interrupt controller 160. If the counter value is not greater than the high-limit threshold, then an alarm signal need not be sent to interrupt controller 160. Similarly, low-limit comparator 154 compares the current counter value to the low-limit threshold that is currently loaded in low-limit comparator 154. If the current counter value is less than the low-limit threshold value, then a notification or alarm signal is sent to interrupt controller 160. An alarm signal need not be generated if the counter value is not less than the low-limit threshold value. Counter assembly 140 may employ any number of additional comparators to provide additional alarm signals at different threshold frequency values. For example, counter assembly 140 may be configured to generate an initial "warning" notification when the measured clock frequency exceeds an intermediate high and/or low frequency threshold. Such intermediate thresholds may be desirable to allow the system or subsystem to take diagnostic or corrective actions in response to a relatively small amount of frequency drifting (and before the frequency of the measurement signal drifts beyond the ultimate high or low frequency thresholds).

Interrupt controller 160 may be configured to distinguish between alarm signals generated by the different limit comparators. The various interrupt outputs are maskable by interrupt controller 160, under the control of the microprocessor. In a practical embodiment, each associated interrupt state bit can always be available to support software polling routines. The output of interrupt controller 160 may be utilized in an appropriate manner by IC 100, the related microprocessor or control system, the subsystem in which IC 100 operates, or the system in which IC 100 operates. For example, the microprocessor, through software, could determine how best to handle an alarm signal, what components should be notified, whether the response should be a change in the data flow inside IC 100 or simply an advisory to some operations, administration, or maintenance function external to IC 100. In accordance with a practical telecommunication device, interrupt controller 160 can function as a trigger mechanism for Alarm Indication Signal (AIS) generation. The AIS feature can facilitate Automatic Protection Switching (APS) and alternative clock selection in response to potential clock signal irregularities.

In another example, through the use of supplemental hardware (in, e.g., IC 100) and/or microprocessor software, counter assembly 102 could be utilized to provide IC 100 with auto ranging clock recovery unit (CRU) capability. As used in a practical telecommunication network application, the CRU would accept data signals over a specified operating range of input data rates. The CRU would recover the embedded clock within a serial stream of an unknown data rate. Due to the necessarily narrow band characteristics of CRUs, their operating point must be swept or stepped through the required operating range. Counter assembly 102, in combination of a hardware/software based search algorithm, would measure, against incrementally set limits, the frequency of the derived clock to facilitate the step or sweep of the CRU throughout its operating range. Not only would the clock rate within the incident data stream be determined, but the ideal operating point of the CRU would be established.

As described above, an embedded counter assembly can also be utilized to verify the operation of an at-rate self-test clock generator. The at-rate self-test clock generator 106 facilitates wafer level or die level testing of IC 100 at clock rates that equal (or closely approach) the clock rates used when IC 100 is actually deployed. The embedded counter assembly and the frequency measurement technique described above can be used to ensure that the at-rate self-test clock is functioning properly during the self-testing procedure. In such an application, the output of the self-test clock generator 106 is routed to the clock input of counter 150, and a suitable reference signal is selected.

The use of IC 100 as an interval timer device will also be described with reference to FIG. 1 and FIG. 3. For purposes of this example, IC 100 has access to an external event gate signal 10; multiplexer 144 is programmed to select this event gate signal which may be subject to optional pulse shaping 143 under microprocessor control, and direct it to the gate input of counter 150. As mentioned above, IC 100 selects one of the clock signals for use as a reference signal; the reference signal will be used to measure the duration of the event. The selection of the reference signal is also dictated by the microprocessor, which controls the operation of multiplexer 146. In this example, the reference signal is routed to the clock input of counter 150.

After being initialized, counter 150 begins counting cycles of the reference signal in response to the opening of the gate (which corresponds to the beginning of the measurable event). Counter 150 counts the reference clock cycles while the gate remains open and stops counting when the gate closes. The closure of the gate corresponds to the end of the measurable event. The duration of the event can be calculated from the accumulated count and the known frequency of the reference clock signal. As described above in connection with the frequency measurement procedure, the resulting count can be stored in a counter register and transferred to the microprocessor via buffer 164. The microprocessor and/or any suitable component of IC 100, the subsystem, or the system can receive and process the counter value to determine the event duration.

High-limit comparator 152 and low-limit comparator 154 can also be utilized to compare the measured event duration to one or more threshold values. In this manner, a notification or an alarm can be generated if the duration of the event does not fall within a specified time period. As mentioned above, IC 100, the subsystem in which it operates, or the system in which it operates can handle alarm signals in an appropriate manner.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An integrated circuit device comprising:
   a die;
   application-specific circuitry formed on said die, said application-specific circuitry utilizing a number of internal clock signals; and
   a counter formed on said die, said counter being configured to receive a number of input signals associated with said number of internal clock signals.

2. An integrated circuit device according to claim 1, wherein:
   said counter is configured to receive a reference signal associated with one of said internal clock signals;
   said counter is configured to receive a measurement signal associated with one of said internal clock signals; and
   said counter is configured to accumulate a count representative of the frequency of said measurement signal relative to said reference signal.

3. An integrated circuit device according to claim 2, wherein said counter is configured to generate an output that represents the frequency of said measurement signal.

4. An integrated circuit device according to claim 3, further comprising a limit comparator connected to said counter, said limit comparator being-configured to compare said output to a threshold value.

5. An integrated circuit device according to claim 4, wherein said threshold value represents an upper frequency limit.

6. An integrated circuit device according to claim 4, wherein said threshold value represents a lower frequency limit.

7. An integrated circuit device according to claim 4, further comprising a notify element connected to said limit comparator, said notify element being configured to generate a notification signal when said output exceeds said threshold value.

8. An integrated circuit device according to claim 1, wherein:
   said counter is configured to receive a reference signal associated with one of said internal clock signals;
   said counter is configured to-receive an external measurement signal; and
   said counter is configured to accumulate a count representative of the frequency of said external measurement signal relative to said reference signal.

9. An integrated circuit device according to claim 1, wherein:

said counter is configured to receive an external reference signal;

said counter is configured to receive an external measurement signal; and said counter is configured to accumulate a count representative of the frequency of said external measurement signal relative to said external reference signal.

10. An integrated circuit device according to claim 1, wherein:

said counter is configured to receive an external reference signal;

said counter is configured to receive a measurement signal associated with one of said internal clock signals; and said counter is configured to accumulate a count representative of the frequency of said measurement signal relative to said external reference signal.

11. An integrated circuit device according to claim 1, wherein:

said counter is configured to receive a reference signal associated with one of said internal clock signals;

said counter is configured to receive an event gate signal that marks a beginning of an event and an end of said event; and said integrated circuit device is configured to measure the duration of said event based upon the frequency of said reference signal and said event gate signal.

12. An integrated circuit device according to claim 11, wherein:

said counter begins counting clock cycles of said reference signal in response to a first transition of said event gate signal; and said counter stops counting clock cycles of said reference signal in response to a second transition of said event gate signal.

13. An integrated circuit device comprising:

a counter configured to receive a reference signal and a measurement signal;

a selection circuit connected to said counter said selection circuit being configured to receive a plurality of input signals, select a first one of said plurality of input signals for use as said reference signal, and select a second one of said plurality of input signals for use as said measurement signal; and application-specific circuitry that utilizes a plurality of internal clock signals, wherein said plurality of input signals are associated with said plurality of internal clock signals.

14. An integrated circuit device according to claim 13, further comprising a die, wherein each of said counter, said selection circuit, and said application-specific circuitry is formed on said die.

15. An integrated circuit device according to claim 13, further comprising a signal conditioning circuit configured to condition one or more of said plurality of internal clock signals, and to generate one or more of said plurality of input signals.

16. An integrated circuit device according to claim 15, wherein said signal conditioning circuit comprises a divider gate.

17. An integrated circuit device according to claim 13, wherein said selection circuit comprises a multiplexer.

18. An integrated circuit device according to claim 13, further comprising a control system configured to control the operation of said selection circuit.

19. An integrated circuit device comprising:

application-specific circuitry that utilizes a clock signal;

a clock generator configured to generate said clock signal during self-testing of said integrated circuit device; and a counter assembly configured to measure the frequency of said clock signal relative to a reference signal.

20. An integrated circuit device according to claim 19, further comprising a die, wherein each of said counter assembly, said at clock generator, and said application-specific circuitry is formed on said die.

21. An integrated circuit device according to claim 19, wherein said counter assembly is configured to determine whether the frequency of said clock signal is within a specified frequency range.

22. An integrated circuit device according to claim 19, wherein said reference signal comprises an internal clock signal utilized by said application-specific circuitry.

23. An integrated circuit device according to claim 19, wherein said reference signal comprises an external clock signal.

* * * * *